United States Patent
Vashchenko

(10) Patent No.: US 7,932,582 B2
(45) Date of Patent: Apr. 26, 2011

(54) COMPACT DUAL DIRECTION BJT CLAMPS

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 414 days.

(21) Appl. No.: 12/214,391

(22) Filed: Jun. 18, 2008

(65) Prior Publication Data

US 2009/0315146 A1 Dec. 24, 2009

(51) Int. Cl.
*H01L 29/735* (2006.01)

(52) U.S. Cl. .................. 257/566; 257/579; 257/E29.187

(58) Field of Classification Search ................. 257/579
See application file for complete search history.

(56) References Cited

U.S. PATENT DOCUMENTS

| | | | | |
|---|---|---|---|---|
| 5,436,475 A | * | 7/1995 | Tews et al. | 257/197 |
| 6,674,147 B2 | * | 1/2004 | Sakamoto | 257/560 |
| 6,853,053 B1 | * | 2/2005 | Vashchenko et al. | 257/565 |
| 7,563,684 B2 | * | 7/2009 | Pellizzer et al. | 438/326 |
| 2002/0135046 A1 | * | 9/2002 | Yu | 257/579 |
| 2006/0267148 A1 | * | 11/2006 | Ma et al. | 257/566 |

* cited by examiner

*Primary Examiner* — Stephen W Smoot

(74) *Attorney, Agent, or Firm* — Jurgen K. Vollrath; Vollrath & Associates

(57) ABSTRACT

In a dual direction BJT clamp, multiple emitter and base fingers are alternatingly connected to ground and pad and share a common sub-collector.

12 Claims, 2 Drawing Sheets

COMPACT DUAL DIRECTION BJT CLAMPS

FIELD OF THE INVENTION

The invention relates to dual direction clamps. In particular it relates to dual direction BJT clamps.

BACKGROUND OF THE INVENTION

Dual direction ESD protection produces challenges both in terms of size as well as triggering voltage.

The present applicant previously developed a dual direction clamp based on the use of a DIAC and ADIAC architecture. This solution has the advantage that it provides a small footprint dual direction device. However, since it is based on non-self aligned BJT junctions it does not always have a good turn on voltage. In fact with a turn on voltage of about 14V it is not suitable for applications requiring a low turn on voltage of about 6-8V.

In another prior art solution, the turn on voltage is addressed by making use of isolated cells of BJT, NMOS or BSCR devices that are packed back to back. This allows standard devices to be used and to make use of control electrode coupling to achieve low triggering voltage. In fact, by making use of silicon germanium (SiGe) BJTs suitable characteristics can be obtained. However, stacking BJTs back to back as proposed by this prior art solution, results in a large footprint device.

SUMMARY OF THE INVENTION

According to the invention, there is provided a dual direction BJT clamp comprising a plurality of emitter and base regions formed in one cell and sharing a common sub-collector region. The emitter and base regions are preferable formed as part of a BiCMOS process and the BJT clamp may be implemented as a SiGe or GaN device and the emitter may be a poly or diffusion emitter.

In particular the BJT clamp may be implemented as a BSCR device. The emitter and base regions may be formed as a standard multi-finger NPN but without the corresponding collector regions. Instead a common sub-collector is provided for the multiple emitter and base fingers. In order to achieve the bi-directional nature of the device, the emitter and base regions are alternatingly connected high and low. The common sub-collector region may comprise a floating NBL and may include a floating n-sinker.

DETAILED DESCRIPTION OF THE INVENTION

Figure 1:
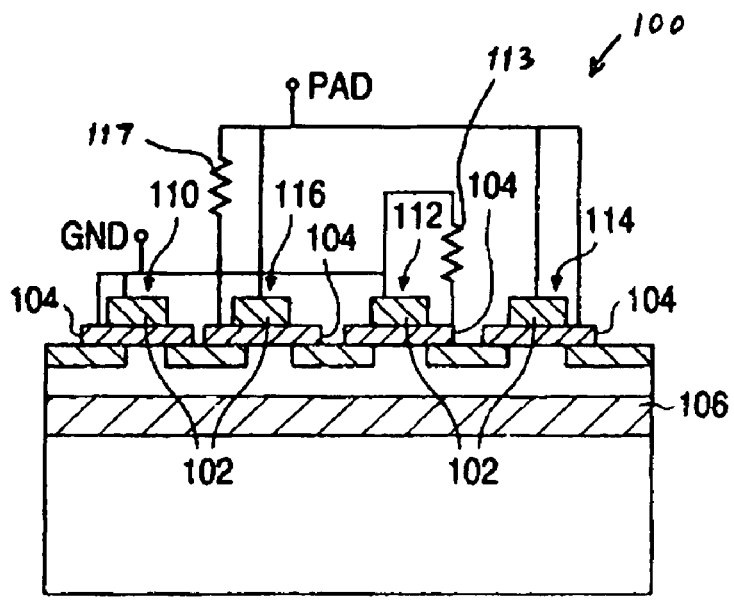
FIG. 1 shows a cross section through one embodiment of a BJT cell of the invention.

FIG. 1 shows a cross section through one embodiment of a bi-directional clamp of the invention. The clamp 100 includes a plurality of emitters 102 and bases 104. The sub-collector is only partially shown and includes an n-buried layer (NBL) 106. As shown in FIG. 1, the emitters 102 and bases 104 are alternatingly connected to ground and pad voltage. In other words every second emitter and base is tied low to define a traditionally connected NPN structure with the sub-collector, which is implemented as a floating sub-collector region (in this embodiment a floating node n-buried layer). These NPN transistors, which are depicted by reference numerals 1110, 112 are also shown schematically in FIG. 2 and serve to handle positive ESD events.

Figure 2:
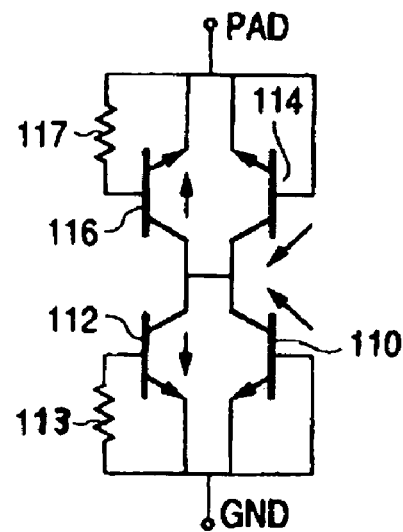
FIG. 2 shows a schematic representation of one embodiment of a BJT cell showing two pnp and two npn device.

The other emitters and bases are tied to the pad, thereby forming an NPN structure with the NBL 106 of the sub-collector that sinks current during a negative ESD event. In this embodiment there are two such reverse connected NPN devices, depicted by reference numerals 114, 116 in FIGS. 1 and 2. As shown in FIGS. 1 and 2 the bases of transistors 112 and 116 are connected via resistors 113 and 117, respectively that act as biasing resistors.

Figure 4:
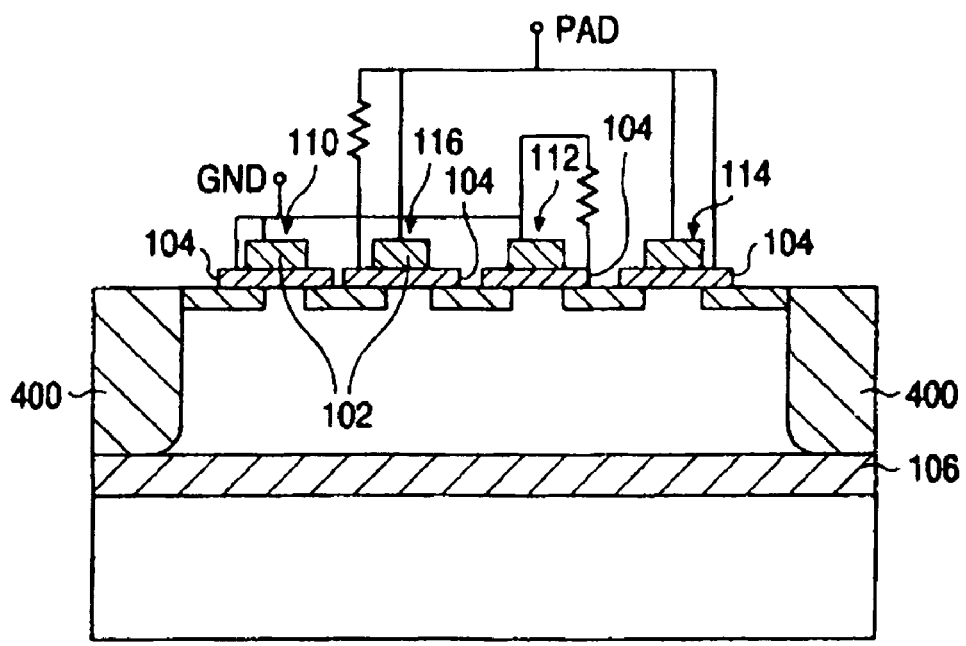
FIG. 4 shows a cross section through another embodiment of a BJT cell of the invention.
Figure 3:
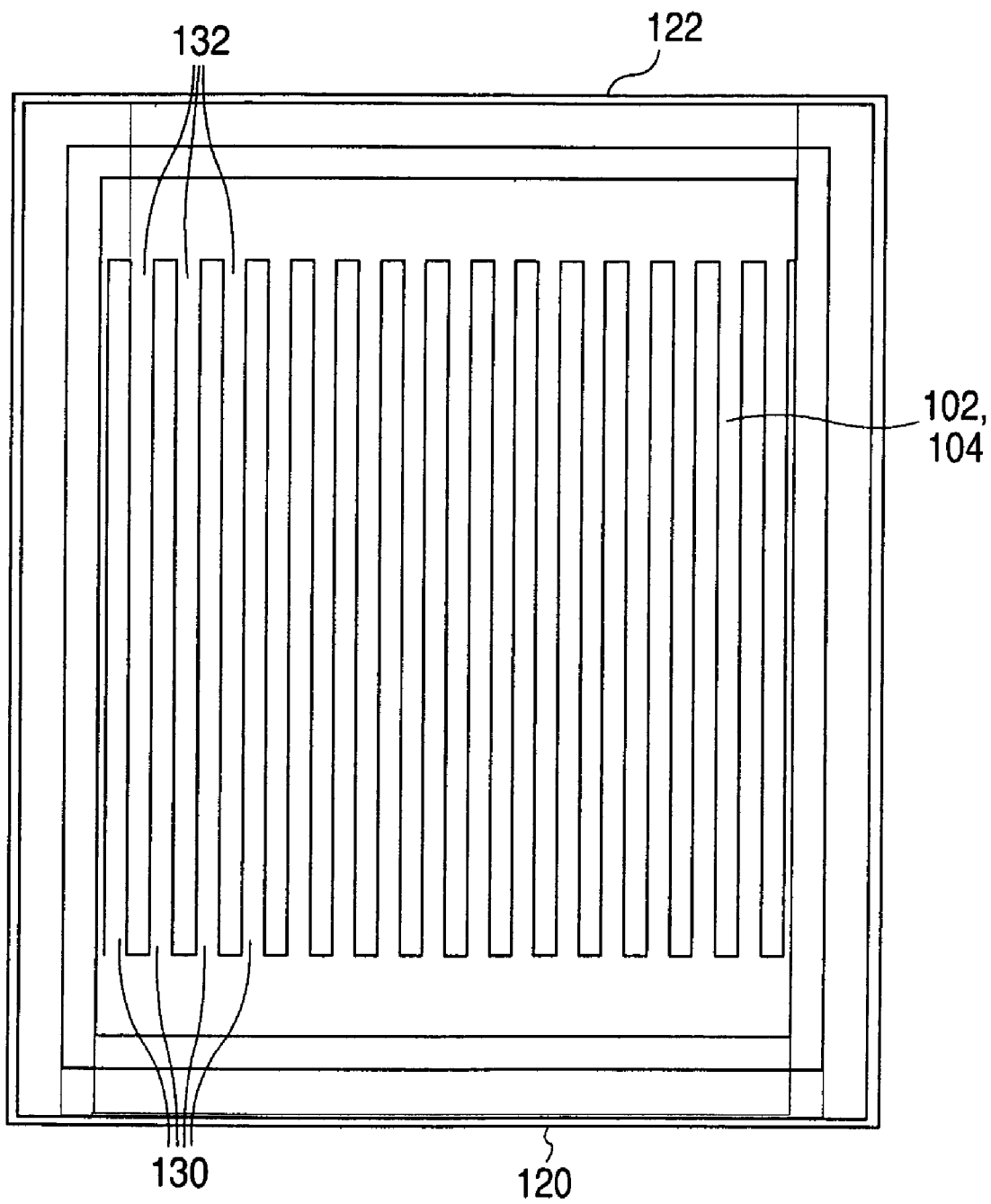
FIG. 3 shows a plan view of a multi-finger NPN in accordance with the invention.

As shown in FIG. 3, the emitters 102 and bases 104 are implemented as a set of fingers in a standard manner as known in the art with ground connection at a first end 120 and pad connection at the second, opposite end 122. Every second base and emitter (depicted generally by reference numeral 130) is connected to the ground end 120, while the other bases and emitters (depicted generally by reference numeral 132) are connected to the pad end. The sub-collector in this embodiment comprises a floating node n-buried layer (NBL). In another embodiment, shown in FIG. 4, a floating n-sinker 400 is included to avoid the SCR effect between the adjacent base-emitter regions. For ease of reference the same reference numerals have been retained to depict the common regions with those shown in FIG. 1.

What is claimed is:

1. A dual direction BJT clamp, comprising a plurality of emitter and base regions formed in one cell and sharing a common sub-collector region, wherein the emitter and base regions are formed as a standard multi-finger NPN without a collector region.

2. A dual direction BJT clamp of claim 1, wherein the emitter and base regions are formed as part of a BiCMOS process.

3. A dual direction BJT clamp of claim 2, wherein the BJT clamp is implemented as a BSCR device.

4. A dual direction BJT clamp of claim 1, wherein the BJT clamp is implemented as a SiGe or GaN device.

5. A dual direction BJT clamp of claim 1, wherein the emitter is a poly or diffusion emitter.

6. A dual direction BJT clamp of claim 1, wherein the common sub-collector includes an NBL.

7. A dual direction BJT clamp of claim 6, wherein the NBL is implemented as a floating node NBL.

8. A dual direction BJT clamp of claim 6, wherein the sub-collector further includes an n-sinker.

9. A dual direction BJT clamp of claim 8, wherein the n-sinker is implemented as a floating n-sinker.

10. A dual direction BJT clamp of claim 1, wherein the emitter and base regions are alternatingly connected high and low.

11. A dual direction BJT clamp of claim 10, wherein the low connection is defined by ground and the high connection is defined by a pad voltage.

12. A dual direction BJT clamp of claim 10, wherein at least some of the high and low connections include bias transistors.

* * * * *